United States Patent [19]

Nakamura et al.

[11] Patent Number: 5,427,858
[45] Date of Patent: Jun. 27, 1995

[54] ORGANIC ELECTROLUMINESCENCE DEVICE WITH A FLUORINE POLYMER LAYER

[75] Inventors: Hiroaki Nakamura; Masahide Matsuura; Tadashi Kusumoto, all of Sodegaura, Japan

[73] Assignee: Idemitsu Kosan Company Limited, Tokyo, Japan

[21] Appl. No.: 877,175

[22] PCT Filed: Oct. 23, 1991

[86] PCT No.: PCT/JP91/01448
§ 371 Date: Jun. 29, 1992
§ 102(e) Date: Jun. 29, 1992

[87] PCT Pub. No.: WO92/10073
PCT Pub. Date: Jun. 11, 1992

[30] Foreign Application Priority Data

Nov. 30, 1990 [JP] Japan .................. 2-336450
Dec. 28, 1990 [JP] Japan .................. 2-409017
May 31, 1991 [JP] Japan .................. 3-129852

[51] Int. Cl.⁶ ............................................. B32B 9/00
[52] U.S. Cl. ........................... 428/421; 313/512; 428/422; 428/917; 428/209
[58] Field of Search .............. 313/504, 505, 506, 511, 313/512, 503; 428/411.1, 209, 422, 917, 690, 421, 422; 118/716

[56] References Cited

U.S. PATENT DOCUMENTS

| 4,853,594 | 8/1989 | Thomas ........................ 428/917 |
| 5,047,687 | 9/1991 | Van Slyke .................... 313/504 |
| 5,061,769 | 10/1991 | Ahoroni et al. ............. 526/245 |
| 5,093,210 | 3/1992 | Ohta ............................ 428/690 |
| 5,094,185 | 3/1992 | Simopoulos .................. 118/716 |
| 5,107,175 | 4/1992 | Hirano et al. ................ 313/512 |
| 5,124,204 | 6/1992 | Yamashita et al. .......... 428/917 |
| 5,139,879 | 8/1992 | Aharoni ....................... 428/422 |
| 5,178,955 | 1/1993 | Ahoroni et al. ............. 428/421 |
| 5,188,901 | 2/1993 | Shimuzu ...................... 428/690 |
| 5,246,782 | 9/1993 | Kennedy ..................... 428/421 |

FOREIGN PATENT DOCUMENTS 61-279096 12/1986 Japan .
63-216291 9/1988 Japan .
1-239795 9/1989 Japan .
2-288188 11/1990 Japan .

Primary Examiner—Patrick J. Ryan
Assistant Examiner—Patrick Jewik
Attorney, Agent, or Firm—Frishauf, Holtz, Goodman & Woodward

[57] ABSTRACT

Disclosed is a novel organic electroluminescent device which can be used as a pixel for graphic display, a pixel for a television image display device or a surface light source, and this novel organic electroluminescent device overcomes the conventional problem of an organic electroluminescent device having a laminated structure in which at least a light-emitting layer formed of a luminescent organic solid is placed between two mutually opposing electrodes, i.e., a short life, by having a film of an electrically insulating polymer compound as a protection layer provided on the outer surface of the above laminated structure. In producing the novel organic electroluminescent device disclosed herein, particularly preferably, the above laminated structure is prepared in a continuous vacuum environment as a series at least from the formation of the light-emitting layer to the formation of the electrode on the light-emitting layer directly or through the electron-injecting layer or the hole-injecting layer as a series, and then the above protection layer is formed in a vacuum environment continued from the above vacuum environment.

15 Claims, 7 Drawing Sheets

ORGANIC ELECTROLUMINESCENCE DEVICE WITH A FLUORINE POLYMER LAYER

TECHNICAL FIELD

The present invention relates to an electroluminescence device (to be referred to as "EL device" hereinafter) such as an electroluminescence element and an electroluminescence lamp and it particularly relates to an organic EL device.

TECHNICAL BACKGROUND

An EL device, which can be largely classified into an inorganic EL device and an organic EL device, has high visibility due to its self-emission, and is excellent in impact resistance and easy to handle since it is a completely solid device. For these reasons, research, development and practical utilization thereof as a pixel for graphic display, a pixel for a television image display device or a surface light source are under way.

An organic EL device has a laminated structure in which a light-emitting layer formed of a fluorescent organic solid such as anthracene, etc., and a hole-injecting layer formed of triphenylamine, etc., are provided, a light-emitting layer and an electron-injecting layer formed of a perylene derivative, etc., are provided, or a hole-injecting layer, a light-emitting layer and an electron-injecting layer are provided, between two electrodes (the electrode on the light-emitting side is a transparent electrode). This laminated structure is generally formed on a substrate.

Such an organic EL device utilizes light emission caused when electrons injected into a light-emitting layer and holes are recombined. Therefore, an organic EL device has advantages that it can be actuated at a low voltage, e.g., 4.5 V and response is fast by decreasing the thickness of the light-emitting layer, and it also has advantages that it gives a high-brightness EL device since the brightness is in proportion to an injected electric current. Further, by changing the kinds of fluorescent organic solids of which the light-emitting layer is to be formed, light emission is obtained in all the colors in the visible regions of blue, green, yellow and red. Since an organic EL device has these advantages, particularly an advantage that it can be actuated at a low voltage, studies thereof for practical use are under way at present.

Meanwhile, a fluorescent organic solid used as a material for forming the light-emitting layer of an organic EL device is susceptible to water, oxygen, etc. Further, an electrode (to be sometimes referred to as "opposite electrode" hereinafter), which is formed on a light-emitting layer directly or through a hole-injecting layer or an electron-injecting layer, is liable to deteriorate in properties due to oxidation. As a result, when a conventional EL device is actuated in the atmosphere, its life as a device is short. Therefore, in order to obtain a practically usable organic EL device, it is required to increase the life thereof by protecting the device so that water, oxygen, etc., do not infiltrate the light-emitting layer and that the opposite electrode does not undergo oxidation.

However, no effective protection method has been developed for the organic EL device. For example, when a method of protecting (sealing) an inorganic EL device, i.e., a method in which a back-surface glass plate is provided outside a back electrode (opposite electrode) and a silicone oil is placed between the back electrode and the back-surface glass and sealed, is applied to the organic EL device, the silicone oil infiltrates the light-emitting layer through the opposite electrode or through the opposite electrode and the hole-injecting layer or the electron-injecting layer, and the light-emitting layer is altered due to the silicone oil. Therefore, the organic EL device immensely deteriorates in light emission properties, or no longer emits light. When a resin coating layer generally used for mechanical protection (the solvent for the coating solution is a cyclic ether-containing solvent such as tetrahydrofuran, etc., a halogen-containing solvent such as chloroform, dichloromethane, etc., or an aromatic hydrocarbon-based solvent such as benzene, toluene, xylene, etc.) is applied to tile protection of the organic EL device, the solvent used in the resin coating solution infiltrates the light-emitting layer like the above silicone oil. Therefore, the organic EL device greatly deteriorates in light emission properties, or does not at all emit light.

It is therefore an object of the present invention to provide an organic EL device which can be produced so that it structurally has a long life.

DISCLOSURE OF THE INVENTION

The organic EL device of the present invention which achieves the above object has a characteristic feature in that the organic EL device having a laminated structure, in which at least a light-emitting layer formed of a luminescent organic solid is placed between two mutually opposing electrodes, has a film of an electrically insulating polymer compound as a protection layer on an outer surface of the above laminated structure.

PREFERRED EMBODIMENTS FOR WORKING THE INVENTION

Figure 1:
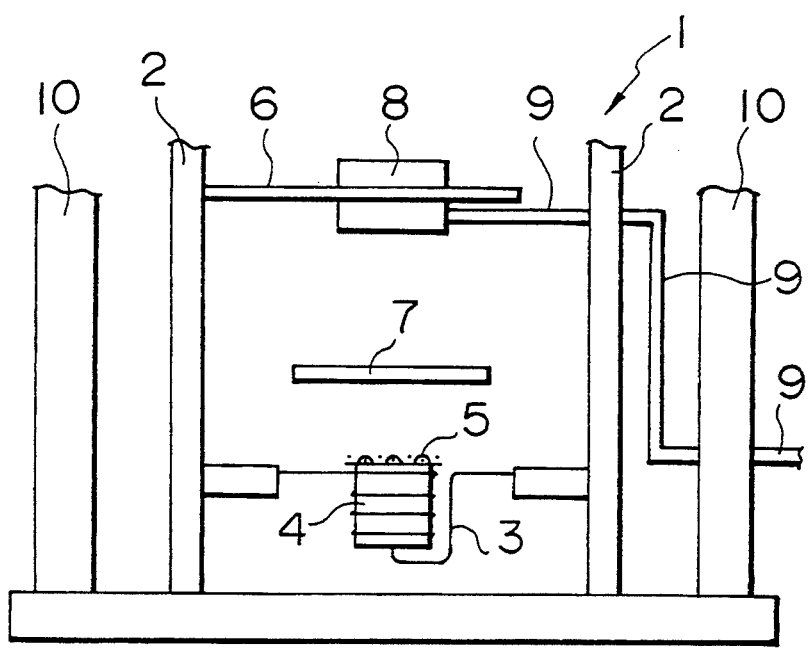
FIG. 1 is a schematic view showing the cross section of a vacuum vapor deposition apparatus used in Examples for the production of the organic EL device of the present invention.

As described above, the organic EL device of the present invention has a film of an electrically insulating polymer compound as a protection layer on the outer surface of a laminated structure in which at least a light-emitting layer formed of a luminescent organic solid is placed between two mutually opposing electrodes. The constitution of the above laminated structure includes the following ① to ④.

① electrode (cathode)/light-emitting layer/hole-injecting layer/electrode (anode)
② electrode (anode)/light-emitting layer/electron-injecting layer/electrode (cathode)
③ electrode (anode)/hole-injecting layer/light-emitting layer/electron-injecting layer/electrode (cathode)
④ electrode (anode or cathode)/light-emitting layer/electrode (cathode or anode).

Any constitution may be used. In general, the laminated structure is formed on a substrate. The size, form, material, etc., of each of the substrate and the laminated structure are properly selected depending upon use of the intended organic EL device such as a surface light source, a pixel For graphic display, a pixel for a television image display device, etc. In addition, each of the above hole-injecting layer and the above electron-injecting layer refers to a layer having any one of charge injection properties, charge transport properties and charge barrier properties, and may have any one of a single-layered structure and a multi-layered structure. The material for these layers may be any one of an organic material and an inorganic material.

The organic EL device of the present invention has a film formed of an electrically insulating polymer compound as a protection layer on the outer surface of the above laminated structure. The protection layer may be formed at least on a main surface of the opposite electrode. However, the protection layer is particularly preferably formed on the entire outer surface of the laminated structure. Further, when the laminated structure has a layer structure in which the opposite electrode is formed on part of a main surface of one of the light-emitting layer, the hole-injecting layer and the electron-injecting layer, it is preferred to form a protection layer at least on that portion of the main surface of a layer underlying the opposite electrode where the opposite electrode is not formed and on the main surface of the opposite electrode.

The method for forming the protection layer of an electrically insulating polymer compound includes:
(1) a physical vapor deposition method (PVD method),
(2) a chemical vapor deposition method (CVD method),
(3) a casting method, and
(4) a spin coating method.

These methods are respectively detailed hereinafter.
(1) PVD method
(i) Kind, film-forming conditions, etc., of the PVD method The PVD method includes a vacuum vapor deposition method (including a vapor deposition polymerization method), a sputtering method, etc. The vacuum vapor deposition method and the sputtering method can be sub-classified as below.

Vacuum vapor deposition method

Resistance heating method, electron beam heating method, high-frequency induction heating method, reactive vapor deposition method, molecular beam epitaxy method, hot wall vapor deposition method, ion plating method, ionized cluster beam method, vapor deposition polymerization method, etc.

Sputtering method

Diode sputtering method, diode magnetron sputtering method, triode and tetraode plasma sputtering methods, reactive sputtering method, ionized beam sputtering method, a method using a combination of these.

Any one of these methods can be employed. Concerning the PVD method, a vacuum vapor deposition method is particularly preferred.

The film forming conditions differ depending upon raw materials and the kind of the PVD method. For example, when a vacuum vapor deposition method (resistance heating method, electron beam heating method and high-frequency induction heating method) is used, preferred are conditions where the pressure before the vapor deposition is generally set at not more than $1 \times 10^{-2}$ Pa, preferably not more than $6 \times 10^{-3}$ Pa, the temperature for heating a deposition source is generally set at not more than 700° C., preferably not more than 600° C., the substrate temperature is generally set at not more than 200° C., preferably not more than 100° C., and the deposition rate is generally set at not more than 50 nm/second, preferably not more than 3 nm/second.

(ii) Kinds of the polymer compound used as a vapor deposition source.

The following polymer compounds (A) to (C) may be used as a deposition source.

(A) Fluorine-free polymer compounds such as polyethylene, polypropylene, polystyrene, polymethyl methacrylate, polyimide (obtained by depositing two monomers on a substrate to polymerize them, see ULVAC Technical Journal, 1988, 30, 22), polyurea (obtained by depositing two monomers on a substrate to polymerize them, see ULVAC Technical Journal, 1988, 30, 22),etc.

(B) Polytetrafluoroethylene, polychlorotrifluoroethylene, polydichlorodifluoroethylene, chlorotriftuoroethylene, a copolymer of chlorotrifluoroethylene and dichlorodifluoroethylene.

(C) Fluorine-containing copolymers having a cyclic structure in the main copolymerized chain.

(C-1) Fluorine-containing polymer compound disclosed in JP,A 63-18964, fluorine-containing polymer compound disclosed in JP,A 63-22206, fluorine-containing polymer compound disclosed in JP,A 63-238115.

(C-2) Fluorine-containing polymer compound disclosed in JP,A 3-129852.

The form of the polymer compound when it is used as a deposition source is not specially limited. The form may be powdery, particulate, bulk-like, disk-like or pellets-like. The form is properly selected depending upon the kind of the PVD method employed for forming the film.

When the polymer compound (B), (C-1) or (C-2) out of the above polymer compounds is used as a deposition source, there can be obtained, by a PVD method, a deposited film (protection layer) which is formed of the same polymer compound as the polymer compound used as a deposition source and is pin-hole free. Further, the decrease in the electric resistivity, breakdown strength and moisture resistance, entailed when the film thickness is decreased, is small. Therefore, the protection layer is excellent in the electric resistivity, breakdown strength and moisture resistance. Further, since the protection layer is transparent, it has no bad effect on the color of light emitted from the light-emitting layer.

As described above, the above polymer compounds (B), (C-1) and (C-2) are particularly superior as a material for the protection layer. Therefore, these polymer compounds are further detailed.

Polymer compound (B)

The molecular weight is not less than 400, preferably from 1,000 to 600,000. When the molecular weight is less than 400, the resultant thin film has low moisture resistance. The molecular weight is particularly preferably 10,000 to 500,000. When a copolymer obtained from chlorotrifluoroethylene and dichlorodifluoroethylene is used, it does not matter what the copolymerization amount ratio in the copolymer is.

As a deposition source, particularly preferred is a chlorotrifluoroethylene homopolymer (polychlorotrifluoroethylene), and specific examples thereof include Neoflon CTFE (trade name) supplied by Daikin Industries, Ltd. and Kel-F CTFE (trade name) supplied by 3M Co., Ltd.

Polymer compound (C-1)

This polymer compound is a copolymer obtained by copolymerizing a monomer mixture containing tetrafluoroethylene and at least one cyclic ether compound containing a carbon-carbon unsaturated bond, and its copolymer main chain has a cyclic structure represented by the following formula.

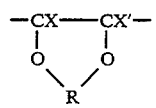

{wherein each of X and X' is F, Cl or H, X and X' may be the same as, or different From, each other, and R is —CF=CF— or has the following formula,

[each of R' and R" is F, Cl, —COF, a —COO-alkyl group, an alkyl group, a perfluorinated alkyl group or a hydrogen-substituted perfluorinated alkyl group ("alkyl group" is an alkyl group having 1 to 6 carbon atoms)]}.

Particularly preferred is a copolymer obtained by copolymerizing tetrafluoroethylene and a cyclic ether compound containing a carbon-carbon unsaturated bond, at least represented by the following formula (I),

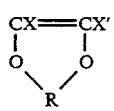   (I)

{wherein each of X and X' is F, Cl or H, X and X' may be the same as, or different from, each other, and R is —CF=CF— or has the Following formula,

[each of R' and R" is F, Cl, —COF, a —COO-alkyl group, an alkyl group, a perfluorinated alkyl group or a hydrogen-substituted perfluorinated alkyl group ("alkyl group" is an alkyl group having 1 to 6 carbon atoms)]}.

Specific examples of the cyclic ether compound containing a carbon-carbon unsaturated bond, represented by the formula (I), are particularly preferably as follows.

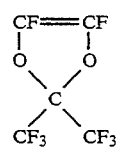

{a compound of the above formula (I) in which both X and X' are F, and R has the formula of

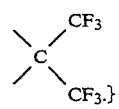

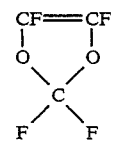

{a compound of the above formula (I) in which both X and X' are F, and R has the formula of

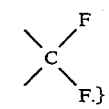

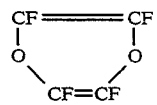

{a compound of the above formula (I) in which both X and X' are F, and R is —CF=CF—.}

In the protection layer, the content of the cyclic ether compound containing a carbon-carbon unsaturated bond, represented by the formula (I), based on the total amount of the tetrafluoroethylene and this compound is preferably 0.01 to 99% by weight, particularly preferably 11 to 80% by weight. The copolymer having such a composition generally has a glass transition point of not less than 50° C.

As a comonomer for the copolymer, a comonomer from the following ① to ③ may be used together with the cyclic ether compound containing a carbon-carbon unsaturated bond, represented by the formula (I).

① Olefin comonomers such as ethylene, 1-butene, isobutylene, trifluoropropene, trifluoroethylene, chlorotrifluoroethylene, etc.

② Vinyl comonomers such as vinyl fluoride, vinylidene fluoride, etc.

③ Perfluoro comonomers such as perfluoropropene, perfluoro(alkyl vinyl ether), methyl 3-[1-[difluoro-[(trifluoroethenyl)oxy]methyl]-1,2,2,2-tetrafluoroethoxy]-2,2,3,3-tetrafluoropropanoate, 3-[1--[difluoro[(trifluoroethenyl)oxy]methyl]-1,2,2,2-tetrafluoroethoxy]-2,2,3,3-tetrafluoropropionate, 2-[1--[difluoro-[(trifluoroethenyl)oxy]methyl]-1,2,2,2-tetrafluoroethoxy]-1,1,2,2-tetrafluoroethanesulfonylfluoride, etc.

The content of the comonomer from the above ① to ③ based on the total amount of the tetrafluoroethylene and the compound (comonomer) of the formula (I) is preferably 0.005 to 30% by weight, particularly preferably 1 to 15% by weight. When the comonomer from the above ① to ③ is used in combination with the comonomer of the formula (I), desirably, the amount of the comonomer from the above ① to ③ is the smallest among the amounts of the tetrafluoroethylene, the comonomer of the formula (I) and the comonomer from the above ① to ③.

Polymer compound (C-2)

Particularly preferred is a fluorine-containing copolymer having a cyclic structure of the following formula in the main chain,

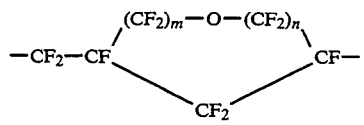

(wherein each of m and n is, independently of other, an integer of 0 to 5, and m+n is an integer of 1 to 6) which is obtained by radical-copolymerizing a perfluoroether having a double bond at each of the terminals, represented by the general formula (II), $$CF_2=CF-(CF_2)_m-O-(CF_2)_n-CF=CF_2 \quad (II)$$

(wherein m and n are as defined above) and a monomer radical-polymerizable with the perfluoroether of the above general formula (II).

As the perfluoroether of the above general formula (II), preferred are those of the formula (II) in which each of m and n is an integer of 0 to 3 and m+n is an integer of 1 to 4, and particularly preferred are those of the formula (II) in which each of m and n is an integer of 0 to 2 and m+n is an integer of 1 to 3. Specific examples thereof are perfluoroallylvinylether ($CF_2=CF-O-CF_2-CF=CF_2$), perfluorodiallyether ($CF_2=CF-CF_2-O-CF_2-CF=CF_2$), perfluorobutenylvinylether ($CF_2=CF-O-CF_2-CF_2-CF=CF_2$), perfluorobutenylallylether ($CF_2=CF-CF_2-O-CF_2-CF_2-CF=CF_2$), perfluorodibutenylether ($CF_2=CF-CF_2-CF_2-O-CF_2-CF_2-CF=CF_2$), etc. Of these perfluoroethers, those of the general formula (II) in which one of m and n is 0, i.e., those having one vinylether group represented by $CF_2=CF-O-$ are particularly preferred in view of copolymerization reactivity, ring-closing polymerizability, gelation inhibition, etc., and perfluoroallylvinylether is a particularly preferable example.

On the other hand, the monomer to be copolymerized with the perfluoroether of the above general formula (II) is not specially limited if it is a monomer having radical-polymerizability. It can be properly selected from fluorine-containing monomers, unsaturated hydrocarbon-based monomers and other monomers. These monomers may be used alone or in combination for the radical copolymerization with the perfluoroether of the above formula (II). In order to make the most of the perfluoroether, it is particularly preferred to use, as a copolymerizable monomer, a fluorine-containing monomer typified by tetrafluoroethylene, chlorotrifluoroethylene, perfluorovinylether, vinylidene fluoride, vinyl fluoride, etc.

The above perfluoroether and the above copolymerizable monomer can be radical-copolymerized by a conventional method such as bulk polymerization in which these are directly polymerized, solution polymerization in which these are dissolved in an organic solvent such as fluorinated hydrocarbon, chlorinated hydrocarbon, fluorochlorinated hydrocarbon, alcohol, hydrocarbon, etc., and polymerized in the solvent, suspension polymerization in which these are polymerized in an aqueous medium in the presence or absence of a proper organic solvent, emulsion polymerization in which these are polymerized in an aqueous medium containing an emulsifier, or other method. Although the proportion of the perfluoroether for the production of the copolymer is not specially limited, this proportion is preferably 0.1 to 99 mol. % as a material to be charged based on the above copolymerizable monomer.

The temperature and pressure during the radical copolymerization are not specially limited, and can be properly selected in view of various factors such as the boiling point of the comonomer, a required heating source, removal of polymerization heat etc. The temperature suitable for the polymerization can be set, e.g., in the range of 0° to 200° C. It is practically preferred to set the temperature in the range of room temperature to about 100° C. The polymerization can be carried out under any pressure conditions, such as reduced pressure, atmospheric pressure and elevated pressure. When the pressure is set at atmospheric pressure to about 100 atmospheric pressure, or at atmospheric pressure to about 50 atmospheric pressure, the polymerization can be practically preferably carried out. The initiation of, and proceeding with, the radical copolymerization at such a temperature under such pressure conditions can be carried out by means of an organic radical initiator, an inorganic radical initiator, light, ionizing radiation, heat, etc.

Specific examples of the organic radical initiator include azo compounds such as 2,2'-azobis(N,N'-dimethyleneisobutylamidine)dihydrochloride, 2,2'-azobis(2-amidinopropane)dihydrochloride, 2,2'-azobis(N,N'-dimethyleneisobutylamidine), etc., organic peroxides such as stearoyl peroxide, diisopropyl peroxydicarbonate, benzoyl peroxide, etc., and the like.

Specific examples of inorganic radical initiator include inorganic peroxides such as $(NH_4)_2S_2O_8$, $K_2S_2O_8$, etc. As light, visible light, ultraviolet light, etc., can be used, and a photosensitizer may be used in combination. The ionizing radiation includes $\gamma$ ray, $\beta$ ray, $\alpha$ ray, etc., from radioactive isotopes such as $^{60}Co$, $^{192}Ir$, $^{170}Tm$, $^{137}Cs$, etc., and electron beam from an electron beam accelerator.

(2) CVD method

It is preferred to use a plasma polymerization method in which a gaseous monomer of ethylene, propylene, tetrafluoroethylene, vinyltrimethoxysilane, hexamethyldisiloxane, tetrafluoromethane, or the like is polymerized to obtain a polymer corresponding to the above monomer.

General pyrolysis CVD is not suitable since the substrate temperature is elevated to a high temperature.

(3) Casting method

A fluorine-containing polymer compound is dissolved in a fluorine-containing solvent such as perfluoroalcohol, perfluoroether, perfluoroamine, or the like and the so-prepared solution was cast on a laminated structure and air-dried for 8 to 16 hours to give a film (protection layer). It does not matter how long the drying is carried out, if it is carried out for at least 8 hours. Since, however, there is no much difference even if the drying time exceeds 16 hours, such a longer drying time is improper. The drying time is generally properly about 12 hours.

The concentration of the raw material in the solution is selected depending upon the thickness of the intended protection layer.

The fluorine-containing polymer compound for use includes the polymer compounds (B), (C) and (d) described concerning the above PVD method.

(4) Spin coating method

A suitable amount of the same solution as that described in the above (3) is dropped on a laminated structure which is being rotated at 100 to 20,000 rpm, preferably 200 to 8,000 rpm, and the laminated structure is further rotated for 5 to 80 seconds, preferably 10 to 30 seconds. Then, the solution was dried in the same manner as in the casting method to obtain a film (protection layer). The amount of the solution to be dropped differs depending upon the size of the laminated structure or an organic EL device to be sealed. In general, when the laminated structure or the organic EL device has a size of a slide glass ($25 \times 75 \times 1.1$ mm), the above amount is 0.6 to 6 ml, preferably 0.5 to 3 ml.

The concentration of the raw material in the solution is properly selected depending upon the thickness of the intended protection layer as is done in the casting method. The range thereof is narrower than that in the casting method, and it is 1 to 40 g/100 ml, preferably 4 to 20 g/100 ml from the viewpoint of control of the layer thickness, layer uniformity, etc.

In both the casting method (3) and the spin coating method (4), it is preferred to further dry the air-dried film with a vacuum dryer, etc., at 30° to 100° C., preferably 50° to 80° C. for 1 to 24 hours, preferably 8 to 15 hours.

By any one of the above-detailed methods (1) to (4), the protection layer can be formed on the outer surface of the laminated structure. Although the thickness of the protection layer depends upon used raw materials and a method for the protection layer formation, the lower limit thereof is 1 nm, preferably 10 nm. When the thickness is set at less than 1 nm, it is difficult to obtain a uniform thin film by any one of the methods. The upper limit thereof cannot be defined since it differs depending upon use of the intended organic EL device and a method for the protection layer formation. In the PVD method, it is about 100 μm from the viewpoint of productivity. When the casting method is employed, a film having a thickness of 100 μm or more can be easily formed. When the side on which the protection layer is formed is used as a light-emitting surface, there are selected raw materials and formation methods to obtain a protection layer having excellent light transmission properties to EL light from the light-emitting layer.

The protection layer that can be formed as described above can sufficiently perform its function even if it has a single-layered structure. It may also have a structure having a plurality of layers, at least two layers, as required. When it has a structure having a plurality of layers, the component of each layer may be the same as, or different from, that of other.

In order to obtain an organic EL device having a long life, it is desirable to prevent the property deterioration of the light-emitting layer and the opposite electrode during the step of forming the protection layer. For this reason, it is particularly preferred to form the protection layer in a vacuum environment by a PVD method or a CVD method. And, for the same reason, it is particularly preferred to carry out the steps from the formation of the light-emitting layer as a constituent of the laminated structure to the formation of the protection layer in a continuous vacuum environment as a series. Further, when the light-emitting layer is formed on the hole-injecting layer or the electron-injecting layer, it is preferred to carry out the steps from the formation of the hole-injecting layer or electron-injecting layer which is to underlie the light-emitting layer to the formation of the protection layer in a continuous vacuum environment as a series.

Among the organic EL devices of the present invention, the organic EL device having a laminated structure formed on a substrate can be produced, for example, according to the following procedures.

1. Formation of first electrode on substrate

The first electrode can be formed by a vacuum vapor deposition method, a sputtering method, a CVD method, a plating method, a printing method, etc., depending upon electrode materials.

The electrode material can be selected from electrically conductive metals such as gold, silver, copper, aluminum, indium, magnesium, sodium, potassium, etc., mixtures of these electrically conductive metals such as a mixture of magnesium with indium, etc., alloys such as sodium-potassium, magnesium-copper, tin-lead, silver-tin-lead, nickel-chromium, nickel-chromium-iron, copper-manganese-nickel, nickel-manganese-iron, copper-nickel, etc., oxides such as stannic oxide, indium oxide, zinc oxide, ITO (indium tin oxide), etc., compounds such as copper iodide (CuI), etc., a laminated material of aluminum (Al) and aluminum oxide ($Al_2O_3$), composite materials such as a combination of synthetic resin and silver, silicone rubber and silver, silver-containing borosilicate glass, etc., and the like, which are conventionally used as an electrically conductive material.

When the first electrode side (substrate side) is used as a light-emitting surface, it is preferred to use a transparent electrode material such as stannic oxide, indium oxide, zinc oxide, ITO, CuI, etc., from the viewpoint of increasing the transmittance to light emitted from the light-emitting layer. The thickness thereof is preferably 10 nm to 1 μm, particularly preferably not more than 200 nm. Due to this, it is preferred to employ a vacuum vapor deposition method, a sputtering method or a CVD method to form a film as an electrode.

The first electrode may be any one of an anode and a cathode. When it is used as an anode, it is preferred to use an electrically conductive material having a larger work function than the material for the second electrode (opposite electrode) to be described later. When it is used as a cathode, it is preferred to use an electrically conductive material having a smaller work function. Further, the anode material preferably has a work function of at least 4 eV, and the cathode material preferably has a work function of less than 4 eV.

In addition, the material for the substrate on which the first electrode is to be formed can be selected from conventional materials such as glass, plastic, quartz, ceramics, etc. When the substrate side is used as a light-emitting surface, a transparent material is used. It is preferred to wash the material by an ultrasonic washing method, etc., before the formation of the first electrode.

When the organic EL device is used as a surface light source, a substrate formed of an electrically conductive material can be used as a substrate, and in this case, the substrate can be used as a first electrode.

2. Formation of light-emitting layer on first electrode

The light-emitting layer can be formed by a vacuum vapor deposition method, a sputtering method, spin coating method, a casting method, etc., while the vacuum vapor deposition method is preferred to obtain a film (layer) which is homogeneous and smooth and which has no pin hole. The light-emitting layer may be formed directly on the first electrode, or may be formed on the first electrode through a hole-injecting layer or an electron-injecting layer.

The material for the light-emitting layer is properly selected from fluorescent organic solids conventionally used as a light-emitting layer material such as a phthaloperinone derivative, a thiadiazole derivative, a stilbene derivative, a coumarin derivative disclosed in JP,A 2-191694, a distyrylbenzene derivative disclosed in JP,A 2-60894, JP,A 2-209988 or JP,A 63-295695, a chelated oxinoid compound, etc., depending upon the emission color kind and electrical and optical properties required of the intended organic EL device or the layer constitution of the laminated structure. The thickness of the light-emitting layer is preferably 5 nm to 5 μm.

The material for the hole-injecting layer which is to be formed between the light-emitting layer and the first electrode as required is preferably selected from materials having a hole mobility of at least $10^{-6}$ cm$^2$/V.second under $10^4$ to $10^6$ V/cm as is done for conventional devices. Specifically, it is selected from a triphenylamine derivative, a polyarylalkane derivative, a pyrazoline derivative, a pyrazolone derivative, an arylamine derivative, a hydrazone derivative, a stilbene derivative, a phenylenediamine derivative, p-type a-Si, P-type SiC, p-type Si crystal, CdS, etc.

The material for the electron-injecting layer which is to be formed between the light-emitting layer and the first electrode as required can be selected from materials used for the electron-injecting layer of conventional organic EL devices such as a nitro,substituted fluorenone derivative, an anthraquinonedimethane derivative, a diphenylquinone derivative, a dioxazole derivative, a thiopyran dioxide derivative, a fluorenylidenemethane derivative, an anthrone derivative, a dioxane derivative, n-type a-Si, n-type SiC, n-type Si crystal, etc.

The hole-injecting layer and the electron-injecting layer from the organic material can be formed in the same manner as in the formation of the light-emitting layer, and the hole-injecting layer and the electron-injecting layer from the inorganic material can be formed by a vacuum vapor deposition method, a sputtering method, etc. For the same reasons described concerning the light-emitting layer, however, a vacuum vapor deposition method is preferred to form it.

3. Formation of second electrode (opposite electrode) on light-emitting layer

The second electrode can be formed in the same manner as in the formation of the first electrode, while it is preferred to form it by a vacuum vapor deposition method, a sputtering method or a CVD method in order to prevent the infiltration of water and oxygen into the light-emitting layer. The second electrode may be formed directly on the light-emitting layer or may be formed on the light-emitting layer through the hole-injecting layer or the electron-injecting layer. However, when it is formed on the light-emitting layer through the hole-injecting layer, the premise therefore is that no hole-injecting layer is present between the first electrode and the light-emitting layer. When the second electrode is formed on the light-emitting layer through electron-injecting layer, the premise is that no electron-injecting layer is present between the first electrode and the light-emitting layer.

When the second electrode is formed directly on the light-emitting layer, it is preferred to form it by a vacuum vapor deposition method.

The material for the second electrode can be selected from materials similar to those used for the first electrode. When the first electrode is used as an anode, it is used as a cathode. When the first electrode is used as a cathode, it is used as an anode. Accordingly, the material therefor is properly selected.

The materials for the hole-injecting layer and the electron-injecting layer which are to be formed between the second electrode and the light-emitting layer as required are as described previously. It is preferred to form these layers by a vacuum vapor deposition method for the same reason as that described in the formation of the light-emitting layer.

The formation of the second electrode (opposite electrode) finishes the formation of the laminated structure on the substrate.

4. Formation of protection layer

This procedure relates to the formation of the characteristic part of the organic EL device of the present invention, and the materials therefor and the method of the formation thereof are as already described.

By the formation of this protection layer, there is obtained the organic EL device of the present invention. A shield layer may be formed on the outer surface of the protection layer for tile purpose of further sufficiently achieving the prevention of infiltration of water and oxygen into the light-emitting layer and mechanically protecting the device.

The shield layer is preferably formed from an electrically insulating glass, an electrically insulating polymer compound or an electrically insulating airtight fluid. At this stage, the laminated structure is protected by the protection layer, and therefore, various methods can be applied to the formation of the shield layer. The method of formation of the shield layer will be described hereinafter with respect to each material.

a. Electrically insulating glass

After the protection layer is formed on the outer surface of the laminated structure formed on the substrate such as a glass substrate, this electrically insulating glass is covered over the protection layer, and the marginal portion of the substrate and the marginal portion of the electrically insulating glass,are bonded together with an adhesive, etc., whereby a shield layer is formed.

That surface of this electrically insulating glass which is on the protection layer side is preferably a polished surface of a photomask grade. This glass is preferably selected from those which have little alkali content, and has a high volume resistance (at least $10^7$ Ωm at 350° C.). Specifically, there can be selected #7059 supplied by Corning Co., Ltd.

The above electrically insulating glass may be provided so that it is directly in contact with the protection layer, or it may be provided on the outer surface of the protection layer through a moisture absorbent layer formed of polyvinyl alcohol, nylon 66, or the like. When the moisture absorbent layer is formed in between, it is preferred to form the moisture absorbent layer on a surface of the electrically insulating glass in advance. In this case, the glass may have a surface rougher than a photomask grade.

b. Electrically insulating polymer compound

A shield layer is formed from an electrically insulating liquid resin or solid resin, for example, by the following method. By an immersing method and a transfer molding method among the below-described methods, the device as a whole (including the substrate when the laminated structure is formed on the substrate) is covered with a shield layer. Therefore, a material for the shield layer is selected to obtain practically sufficient light transmission property to EL light from the organic EL device to be sealed. In other methods, a shield layer can be formed on the surface on the protection layer side alone when the laminated structure is formed on the substrate. Therefore, it is not necessary to consider the light transmission property of the shield layer as far as the surface on the protection layer side is not used as a light-emitting surface.

1. When liquid resin is used

Casting method: In this method, a shield layer is formed by placing the organic EL device (to be sometimes referred to as "protection layer-coated device" hereinafter) in a mold container, injecting a liquid resin, to which a catalyst and a curing agent have been added, into the mold container to cover the protection layer side surface of the protection layer-coated device with this liquid resin, curing it, removing the mold, and then completely curing it in an oven. More preferably, the curing is carried out in a temperature-controlled oven.

In this case, the liquid resin may be any one of thermosetting and photosetting resins if they are electrically insulating (to be sometimes referred to as "condition (i)" hereinafter). When the surface on the protection layer side is used as a light-emitting layer, there is selected a resin which gives a resin layer having practically sufficient light transmission property to EL light from the organic EL device to be sealed (to be sometimes referred to as "condition (ii)" hereinafter). Concerning the thermosetting resin, it is preferred to use one of which the curing temperature is lower than the softening point of the electrically insulating polymer compound forming the protection layer (to be sometimes referred to as "condition (iii)" hereinafter).

The thermosetting liquid resin that satisfies the conditions (i) and (ii) preferably includes an epoxy resin, a silicone resin, an epoxysilicone resin, a phenolic resin, a diallylphthalate resin, an alkyd resin, etc. For practical use, a liquid resin is selected depending upon whether or not it satisfies the condition (iii).

The photosetting liquid resin that satisfies the conditions (i) and (ii) includes ultraviolet light-curing resins such as BY-300B (trade name of an ene.thiol type photosetting liquid resin, supplied by Asahi Denka Co., Ltd.), BU-230U (trade name of acrylic photosetting liquid resin, supplied by Toagosei Chemical Industries Co., Ltd.), UV1001 (trade name of a polyester-based photosetting liquid resin, supplied by Sony Chemical Co., Ltd.), etc., and visible light-curing resins such as LCR000 (trade name, supplied by I.C.I. Japan), etc.

The curing temperatures and curing times of these liquid resins differ depending upon the resins. For example, when a thermosetting epoxy resin is used, it is cured at 160° to 180° C. for 1 to 2 minutes. In any one of the thermosetting and photosetting liquid resins, it is preferred to add a step of degassing in vacuum after a catalyst and a curing agent are added to the resins, Vacuum potting method: In this method, a shield layer is formed by carrying out all the steps of the above-described casting method in vacuum. This method is more preferable than the casting method.

Dipping method: In this method, a shield layer is formed by dipping the protection layer-coated device in the above liquid resin, pulling it up, and then curing a coating of a liquid resin on the protection layer-coated device by heat-treating it or air-drying it.

A variety of thermoplastic resins, thermosetting or photosetting resins may be used if they satisfy the conditions (i) and (ii).

Others: A shield layer may be formed by applying a liquid resin to the protection layer side surface of the protection layer-coated device with a spatula, etc., and curing it. The liquid resin can be selected directly from the above-described liquid resins, When the surface on the protection layer side is not used as a light-emitting layer, even a resin that does not satisfy the condition (ii) may be used.

2. When liquid resin is used while it is in a solid state:

Hot-melt method: In this method, a shield layer is formed by casting or vacuum-potting a heated and molten resin. The resin used in this method is preferably selected from thermoplastic resins which satisfy the condition (i) and which also has the melting point which is lower than the softening point of the electrically insulating polymer compound forming the protection layer (to be sometimes referred to as "condition (iv)" hereinafter).

Specific examples of the thermoplastic resins which satisfy the condition (i) include halogenated vinyl polymers or halogenated vinyl copolymers such as polyvinyl chloride, polyvinyl bromide, polyvinyl fluoride, a vinyl chloride-vinyl acetate copolymer, a vinyl chloride-ethylene copolymer, a vinyl chloride-propylene copolymer, a vinyl chloride-vinylidene chloride copolymer, a vinyl chloride-butadiene copolymer, a vinyl chloride-acrylic acid ester copolymer, a vinyl chloride-acrylonitrile copolymer, a vinyl chloride-styrene-acrylonitrile terpolymer, a vinyl chloride-vinylidene chloride-vinyl acetate copolymer, polyvinylidene chloride, polytetrafluoroethylene, polyvinylidene fluoride, polychlorotrifluoroethylene, a fluorine-containing polymer compound disclosed in JP,A 63-18964, a fluorine-containing polymer compound disclosed in JP,A 63-22206, a fluorine-containing polymer compound disclosed in JP,A 63-238115, etc.;

polymers of unsaturated alcohols or unsaturated ethers, or copolymers of unsaturated alcohols and unsaturated ethers such as polyvinyl alcohol, polyallyl alcohol, polyvinyl ethel, polyallyl ether, etc.;

polymers or copolymers obtained from unsaturated carboxylic acids such as acrylic acid, mothacrylic acid, etc.;

polymers or copolymers of those having an unsaturated bond in the alcohol moiety, i.e., polyvinyl esters such as polyvinyl acetate and polyacrylic esters such as polyphthalic acid;

polymers or copolymers of those having unsaturated bond(s) in the acid moiety or in the acid moiety and the alcohol moiety such as polyacrylic acid ester, polymethacrylic acid ester, a maleic acid ester polymer, a fumaric acid ester polymer, etc.;

an acrylonitrile polymer, a methacrylonitrile polymer, a copolymer obtained from acrylonitrile and methacrylonitrile, polyvinylidene cyanide, a malononitrile polymer, a fumaronononitrile polymer, a copolymer obtained from malononitrile and fumaronononitrile;

polymers of aromatic vinyl compounds such as polystyrene, poly-α-methylstyrene, poly-p-methylstyrene, a styrene-p-methylstyrene copolymer, polyvinylbenzene, polyhalogenated styrene, etc.;

polymers or copolymers of heterocyclic compounds such as polyvinylpyridine, poly-N-vinylpyrrolidine, poly-N-vinylpyrrolidone, etc.;

polyester condensates such as polycarbonate, etc., and polyamide condensates such as nylon 6, nylon 66, etc.;

a polymer obtained from at least one substance selected from the group consisting of maleic anhydride, fumaric anhydride, an imidation compound of maleic anhydride and imidation compound of fumaric anhydride, or a copolymer obtained from at least two substances selected from the above group;

heat-resistant polymer compounds such as polyamide, polyetherimide, polyimide, polyphenylene oxide, polyphenylene sulfide, polysulfone, polyethersulfone, polyarylate, etc.;

polyethylene, polypropylene, polyethylene terephthalate, polymethyl methacrylate, and a thermotropic liquid crystal polymer disclosed in JP,A 2-253952.

A resin for practical use is properly selected depending upon whether it satisfies the condition (iv).

Fluidization dipping method: There is used a container having a micropore bottom plate, a porous bottom plate and an air (compressed air) reservoir positioned below the porous bottom plate. A solid resin (powdered resin) pulverized to a size of 200 to 300 mesh is placed on the micropore bottom plate, and compressed air is flowed from below through the porous bottom plate, whereby the powdered resin can be handled like a fluid.

In this method, therefore, a shield layer is formed by tilting the container while the compressed air is flowed through the powdered resin, and placing the protection layer-coated device heated to a temperature higher than the softening point of the powdered resin thereby to fuse the powdered resin and attach it to the heated protection layer-coated device.

The resin for use in this method is preferably selected from the thermoplastic resins described as examples concerning the hot-melt method.

Transfer molding method: In this method, a shield layer is formed by placing the protection layer-coated device in a mold (having an aperture), introducing a resin melted in a pot into the cavity of the mold through the aperture and curing the resin.

The resin for use in this method is preferably selected from those thermoplastic resins which are described as examples concerning the hot-melt method and satisfy the foregoing condition (ii).

Others: A shield layer may be formed by applying a resin solution to the protection layer side surface of the protection layer-coated device and dissipating the solvent in the resin solution by heat treatment or air-drying. In this case, there may be used a resin which at least satisfies the condition (i) and which is soluble in any one of a halogen-containing solvent, an aromatic hydrocarbon solvent and a fluorine-containing solvent. An acrylic resin, polystyrene, etc., are selected as a preferred resin. Further, an organic solvent dissipation type adhesive is one of preferred resins. Specifically, there are 1001B (trade name of an elastomer-type, organic solvent dissipation type adhesive, supplied by Nippon Zeon Co., Ltd.), SG4693 (trade name of an organic solvent dissipation type adhesive, supplied by 3M Co., Ltd.), etc.

3. Film sealing

In this method, a shield layer is formed by covering the protection layer-coated device with a polymer film. In this case, the protection layer-coated device as a whole (including the substrate when the laminated structure is formed on the substrate) may be covered with a polymer film, or in the protection layer-coated device in which the laminated structure is formed on the substrate, the protection layer side surface alone may be covered with a polymer film.

When the protection layer-coated device as a whole is covered with a polymer film, the protection layer-coated device is covered with polymer films from above and below, and the upper-positioned and lower-positioned polymer films are thermally fused and bonded to each other along the marginal portion of the protection layer-coated device. When the protection layer side surface alone is covered with a polymer film, the marginal portion of the polymer film and the substrate are bonded to each other with an adhesive, or when the laminated structure is formed on a polymer substrate, the marginal portion of the polymer film and the substrate are thermally fused and bonded to each other.

Concerning the material of the polymer film, preferred is a polymer film which satisfies the conditions (i) and (ii). Specific examples thereof include polyethylene, polypropylene, polyethylene terephthalate, polymethyl methacrylate, polystyrene, polyether sulfone, polyarylate, polycarbonate, polyurethane, an acrylic resin, polyacrylonitrile, polyvinyl acetal, polyamide, polyimide, a diacrylphthalate resin, a cellulose-containing plastic, polyvinyl acetate, polyvinyl chloride, polyvinylidene chloride, and copolymers obtained from two or at least three of these. Particularly preferred as a polymer film are films obtained by subjecting to a stretching method, etc., polymer compounds having low water vapor permeability such as polyvinyl fluoride, polychlorotrifluoroethylene, polytetrafluoroethylene, a fluorine-containing polymer compound disclosed in JP,A 65-18964, a fluorine-containing polymer compound disclosed in JP,A 63-22206, a fluorine-containing polymer compound disclosed in JP,A 63-238115, and the like. In addition, the polymer film used for covering the surface of the protection layer-coated device other than the light-emitting surface may be a film which does not satisfy the condition (ii).

The polymer film used here may be a single-layered film, while it is more preferred to use a polymer film having a structure of a plurality of layers in which a moisture absorbent layer of nylon 66, polyvinyl alcohol, or the like is formed. The polymer film having a structure of a plurality of layers in which the moisture absorbent layer is formed is used so that the moisture absorbent layer is in contact at least with the protection layer.

c. Electrically insulating airtight fluid

A shield layer is formed by sealing both the organic EL device provided with the protection layer (protection layer-coated device) and a gas or a liquid satisfying the condition (i) in a container such as glass container, a ceramic container, a plastic container, or the like which satisfies the above condition (i). When the container wall and the airtight fluid are positioned outside the light-emitting surface of the protection layer-coated device, these are required to satisfy the above conditions (ii) as well.

In the protection layer-coated device in which the laminated structure is formed on the substrate, the substrate may be used as part of the above container. The container is formed by bonding necessary members with a low-melting-point glass, solder, an airtight-sealing epoxy resin, or the like.

The gas sealed in the container preferably includes inert gases such as a He gas, an Ar gas, a Ne gas, etc. The liquid includes a silicone oil, etc. When the substrate is used as part of the container in which the liquid is sealed in, a moisture absorbent such as silica gel, activated carbon, or the like may be included on the premise that the protection layer side of the protection layer-coated device will not be used as a light-emitting surface.

When the shield layer is provided outside the protection layer as described above, the infiltration of water, oxygen, etc., into the light-emitting layer is further inhibited by these two layers. Therefore, there can be obtained an organic EL device having a longer life than an organic EL device provided with the protection layer alone.

As explained above, the organic EL device of the present invention has the protection layer on the outer surface of the laminated structure. Even when this protection layer is formed by a formation method different from that for the light-emitting layer or by means of a film-forming apparatus different from that for the light-emitting layer, it can be produced for a short production time for which the light-emitting layer is exposed to the atmosphere. Therefore, it can be formed while fully preventing the infiltration of water, oxygen, etc., into the light-emitting layer at the production step. After the protection layer is formed, the infiltration of water, oxygen, etc., into the light-emitting layer can be fully prevented by this protection layer.

Therefore, the organic EL device of the present invention has a longer life than any conventional organic EL device.

Further, a vacuum vapor deposition method is applied to the method of forming the laminated structure on the substrate and the method of forming the protection layer, whereby the formation of the laminated structure and the formation of the protection layer can be carried out as a series in one vapor deposition apparatus. In this case, the interface between one layer and a neighboring layer does not contact water, oxygen, etc., and therefore, there can be obtained an organic EL device having a much longer life.

When the shield layer is formed outside the protection layer, the infiltration of water, oxygen, etc., into the light-emitting layer can be further inhibited. Therefore, there can be obtained an organic EL device having a longer life than an organic EL device provided with the protection layer alone.

As described above, the organic EL device of the present invention is an organic EL device which can be structurally produced as a device having a long life.

Examples of the present invention will be described hereinafter. In the following Examples, organic EL devices of the present invention which were provided with a protection layer alone are consecutively referred to as an organic EL device $A_1$, an organic EL device $A_2$, . . . an organic EL device $A_n$, and organic EL devices which were provided with a shield layer outside the protection layer as well are consecutively referred to as an organic EL device $B_1$, an organic EL device $B_2$, . . . an organic EL device $B_n$.

EXAMPLE 1

A glass plate having a size of $28 \times 75 \times 1.1$ mm on which an ITO electrode having a film thickness of 100 nm was formed (supplied by HOYA Corp.) was used as a transparent substrate. This transparent substrate was subjected to ultrasonic cleaning with isopropyl alcohol for 30 minutes, and then cleaned with pure water for 30 minutes. Further, it was subjected to ultrasonic cleaning with isopropyl alcohol for 30 minutes.

The cleaned transparent substrate was fixed on a substrate holder in a commercially available vacuum vapor deposition apparatus (supplied by Nihon Shinku Gijutsu K. K. (ULVAC)]. And, 200 mg of N,N'-diphenyl-N,N'-bis-(3-methylphenyl) -(1,1'-bisphenyl)-4,4'-diamine (to be referred to as "TPDA" hereinafter) as a material for a hole-injecting layer was placed in a molybdenum resistance heating boat, and 200 mg of tris(8-quinolinol)aluminum (to be referred to as "Alq." hereinafter) as a material for a light-emitting layer was placed in other molybdenum resistance heat boat. The pressure in the vacuum chamber was reduced to $1 \times 10^{-4}$ Pa.

Then, the molybdenum resistance heating boat in which TPDA was placed was heated up to 215° to 220° C. to deposit TPDA on the ITO film constituting the transparent substrate at a deposition rate of 0.1 to 0.3 nm, whereby a hole-injecting layer having a layer thickness of 60 nm was formed. At this time, the substrate temperature was at room temperature. Then, while the transparent substrate on which the hole-injecting layer was formed was fixed on the substrate holder, the molybdenum resistance heating boat in which Alq. was placed was heated up to 265° to 273° C. to deposit Alq. on the hole-injecting layer at a deposition rate of 0.1 to 0.2 nm, whereby a light-emitting layer having a layer thickness of 60 nm was formed. At this time, the substrate temperature was also at room temperature.

Then, 1 g of magnesium as a material for an electrode was placed in the molybdenum resistance heating boat, 500 mg of indium was placed in the other molybdenum resistance heating boat, and the pressure inside the vacuum chamber was reduced to $2 \times 10^{-4}$ Pa. Then, the molybdenum resistance heating boat in which magnesium was placed was heated up to about 500° C., and the molybdenum resistance heating boat in which indium was placed was heated up to about 800° C. to concurrently deposit magnesium on the light-emitting layer at a deposition rate of 1.7 to 2.8 nm and indium at a deposition rate of 0.03 to 0.8 nm, whereby there was formed a 150 nm thick electrode (opposite electrode) of a mixed metal of magnesium and indium. At this time, the substrate temperature was also at room temperature.

Thereafter, a protection layer was formed on the outer surface of the laminated structure formed, on the glass plate, of the ITO electrode, the hole-injecting layer, the light-emitting layer and the opposite electrode, by means of the same vacuum deposition apparatus as that used for the formation of the laminated structure in the following manner.

At first, as shown in FIG. 1, an alumina crucible 4 containing 1.5 g of a commercially available chlorotrifluoroethylene homopolymer (trade name: Kel-F, supplied by 3M Co., Ltd., molecular weight 100,000, to be referred to as "PCTFE" hereinafter) as a deposition source for a protection layer was placed in a tungsten basket resistance heater S positioned in a vacuum chamber 2 constituting a vacuum vapor deposition apparatus 1, and a 12 μmØ stainless mesh 5 was covered on the alumina crucible 4. Further, the transparent substrate 6 on which the laminated structure was formed was arranged above the tungsten basket resistance heater 3 through a shutter 7.

Then, the pressure in the vacuum chamber 2 was reduced to $1 \times 10^{-4}$ Pa, and electricity was applied to the tungsten basket resistance heater 3 to heat the deposition source (PCTFE) to 478° C. and form a fluorine-containing polymer layer [PCTFE thin film (protection layer)] having a thickness of 1.2 μm on the outer surface of the laminated structure at a deposition rate of 0.5 nm/s. The substrate temperature at this time was again at room temperature. The formation of the protection layer on the outer surface of the laminated structure gave an organic EL device $A_1$ of the present invention.

In addition, the layer thickness and deposition rate of each of the layers other than the ITO electrode were controlled by monitoring the thickness of each deposition layer with a quartz oscillator type film thickness monitor 8 (supplied by Nihon Shinku Gijutsu K. K. (ULVAC)) arranged in the vacuum chamber 2. Each of the so-obtained layers was measured for a thickness with a probe type film thickness measuring device, and it was confirmed that the so-obtained values were in agreement with reading by the quartz oscillator type film thickness monitor 8. The quartz oscillator type film thickness monitor 8 was provided with a support tool 9 including a tube for coolant water for cooling the quartz oscillator type film thickness monitor 8, and this support tool 9 was supported by a support wall 10 positioned outside the vacuum chamber 2.

EXAMPLE 2

Example 1 was repeated except that the thickness of the PCTFE thin film was changed to 400 nm (0.4 μm) to give an organic EL device $A_2$ of the present invention.

EXAMPLE 3

A laminated structure having an ITO electrode, a hole-injecting layer, a light-emitting layer and an opposite electrode was formed on a glass plate exactly in the same manner as in Example 1.

Then, a fluorine-containing polymer layer [Teflon AF thin film (protection layer)] having a layer thickness of 0.8 μm (800 nm) was formed on the outer surface of the laminated structure formed on the glass plate in the same manner as in Example 1 except that 1.5 g of an amorphous copolymer powder (trade name: Teflon AF, supplied by E. I. du Pont de Nemoure & Co.) obtained from tetrafluoroethylene and perfluoro-2,2-dimethyl-1,3-dioxole was used as a deposition source for a protection layer and that the temperature for heating this deposition source was set at 455° C. At this time, the substrate temperature was at room temperature. The formation of the protection layer on the outer surface of the laminated structure gave an organic EL device $A_3$ of the present invention.

EXAMPLE 4

The same transparent substrate as that used in Example 1 was subjected to ultrasonic cleaning with isopropyl alcohol for 5 minutes, cleaned with pure water for 5 minutes and then subjected to ultrasonic cleaning with isopropyl alcohol for 5 minutes.

Then, a hole-injecting layer, a light-emitting layer and an opposite electrode were formed on the cleaned transparent substrate in the same manner as in Example 1 to give a laminated structure having an ITO electrode, the hole-injecting layer, the light-emitting layer and the opposite electrode.

Thereafter, a fluorine-containing polymer layer [Cytop thin film (protection layer)] having a layer thickness of 0.8 μm (800 nm) was formed on the outer surface of the laminated structure formed on the glass plate in the same manner as in Example 1 except that 1.5 g of an amorphous radical copolymer powder (trade name: Cytop, supplied by Asahi Glass Co., Ltd., intrinsic viscosity 0.425) of 65.8 mol. % of tetrafluoroethylene and 34.2 mol. % of perfluoroallylvinyl ether ($CF_2=CF—O—CF_2—CF=CF_2$) was used as a deposition source for a protection layer and that the temperature for heating this deposition source was set at 460° C. At this time, the substrate temperature was at room temperature. The formation of the protection layer on the outer surface of the laminated structure gave an organic EL device $A_4$ of the present invention.

EXAMPLE 5

An ITO film having a thickness of 100 nm was formed on a glass plate having a size of $25 \times 75 \times 1.1$ mm (white sheet glass, supplied by HOYA Corp.) as a substrate, and used as a transparent electrode (the substrate on which the ITO film was formed is referred to as "transparent substrate" hereinafter). This transparent substrate was subjected to ultrasonic cleaning with isopropyl alcohol for 30 minutes, cleaned with pure water for 5 minutes and then rinsed with isopropyl alcohol, and it was dried by blowing an $N_2$ gas against it. Then, the transparent substrate was cleaned with a UV ozone cleaning apparatus (supplied by Samco International) for 10 minutes.

A hole-injecting layer having a thickness of 60 nm was formed from TPDA on the ITO film of the cleaned transparent substrate in the same manner as in Example 1. Further, a light-emitting layer having a thickness of 60 nm was formed from Alq. on the hole-injecting layer in the same manner as in Example 1. During the formation of these, the substrate temperature was at room temperature.

After the light-emitting layer was formed, a molybdenum resistance heating boat in which 1 g of magnesium had been placed prior to the formation of the hole-injecting layer and a molybdenum resistance heating boat in which 500 mg of silver had been similarly placed were respectively heated without destroying the vacuum environment. And, the magnesium was deposited at a deposition rate of about 1.5 nm/s, and at the same time, the silver was deposited at a deposition rate of about 0.1 nm/s to form a 150 nm thick electrode (opposite electrode) of a mixed metal of magnesium and silver. The formation of the ITO film (electrode), the hole-injecting layer, the light-emitting layer and the opposite electrode on the substrate gave an organic EL device. In this organic EL device, the laminated structure was formed of the ITO film (electrode), the hole-injecting layer, the light-emitting layer and the opposite electrode.

Thereafter, a fluorine-containing polymer layer [Teflon AF thin film (protection layer)] having a layer thickness of 0.8 μm (800 nm) was formed on the outer surface of the laminated structure in the same manner as in Example 3. However, Teflon AF as a deposition source for the protection layer had been placed in an alumina crucible prior to the formation of the hole-injecting layer, and the crucible had been placed in a tungsten basket prior to the formation of the hole-injecting layer. And, the protection layer was formed without destroying the vacuum environment in the vacuum vapor deposition apparatus after the formation of the opposite electrode, in other words, in a vacuum environment as a series starting the formation of the hole-injecting layer. The substrate temperature at a protection layer formation time was at room temperature. The formation of the protection layer on the outer surface of the laminated structure gave an organic EL device $A_5$ of the present invention.

EXAMPLE 6

At first, an organic EL device $A_5$ was obtained in the same manner as in Example 5.

Then, this organic EL device $A_5$ was taken out of the vacuum chamber, and a shield layer was formed outside the protection layer in the following manner.

An electrically insulating glass substrate (the glass had a size of 25×75×1.1 mm) having a 350 nm thick polyvinyl alcohol (to be referred to as "PVA" hereinafter) layer as a moisture absorbent layer on one main surface was prepared. This glass substrate had been obtained by dropping 1 ml of a solution prepared by mixing 3% by weight of a PVA powder, 0.05% by weight of hydrochloric acid and 96.5% by weight of water on a slide glass, spin-coating it with a spin-coating apparatus (supplied by Mikasa K. K.) at 500 rpm for 30 seconds, air-drying it for 8 hours, and drying it in a vacuum dryer (supplied by Yamato Kagaku Co., Ltd.) at 60° C. for 10 hours.

Then, an epoxy-based adhesive (Cemedine Hisuper 5, supplied by Cemedine Co., Ltd.) was applied to the marginal portion of the PVA layer side of the above glass substrate so that the applied portion was about 0.5 mm wide, and thereafter, this glass substrate and the organic EL device A were attached to each other. This attaching was carried out such that the PVA layer and the protection layer were in contact with each other. The epoxy-based adhesive was used after its main component and its curing agent were stirred with a spatula 20 times.

Thereafter, the epoxy-based adhesive was cured in atmosphere for 10 hours, whereby the shield layer of an electrically insulating glass was formed outside the protection layer. The formation of this shield layer gave an organic EL device $B_1$ of the present invention.

EXAMPLE 7

An organic EL device (provided with no protection layer) was prepared in the same manner as in Example 5, and then, after the vacuum environment of the vacuum vapor deposition apparatus used for the formation of the laminated structure was once destroyed, a protection layer was formed on the outer surface of the laminated structure with the same vacuum vapor disposition apparatus as that used for the formation of the laminated structure.

At first, an alumina crucible containing 1 g of high-density polyethylene (trade name 440M, supplied by Idemitsu Petrochemical Co., Ltd.) as a deposition source was placed in a tungsten basket, and a 12 μmØ stainless steel mesh was covered on this alumina crucible. Then, the above-obtained organic EL device was set on a sample holder, and the pressure in the vacuum chamber was reduced to $1 \times 10^{-4}$ Pa. Thereafter, the deposition source was heated to 400° C. by applying electricity to the tungsten basket to form a 0.3 μm (300 nm) thick high-density polyethylene thin film (protection layer) on the outer surface of the laminated structure at a deposition rate of 0.5 nm/s. The formation of the protection layer on the outer surface of the laminated structure gave an organic EL device $A_6$ of the present invention.

Thereafter, the organic EL device $A_6$ was taken out of the vacuum chamber, and an epoxy-based adhesive (Cemedine Super 5, supplied by Cemedine Co., Ltd.) was applied to the protection layer such that the adhesive thickness was 2 mm thick. The organic EL device $A_6$ was allowed to stand in the atmosphere for 5 hours to cure the epoxy-based adhesive, whereby a shield layer was formed. The formation of this shield layer gave an organic EL device $B_2$ of the present invention. In addition, the epoxy-based adhesive was applied with it on a spatula after its main component and curing agent were stirred with the spatula 20 times.

EXAMPLE 8

Figure 2:
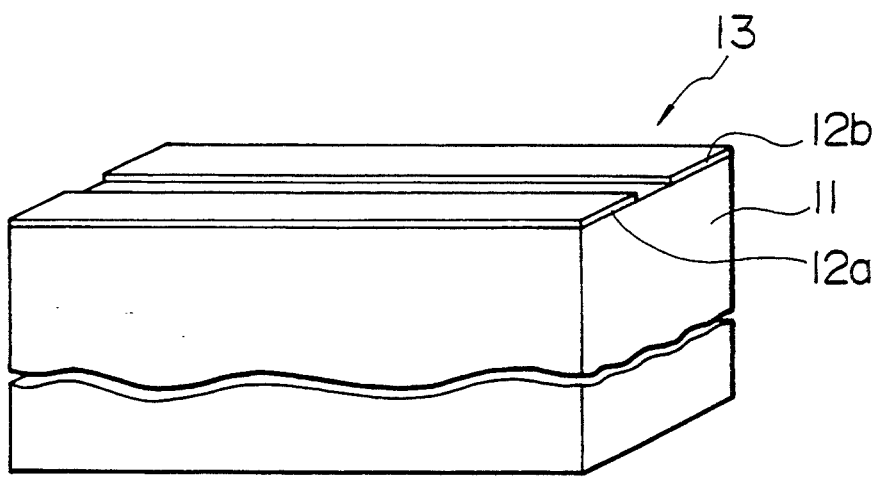
FIG. 2 is a perspective view schematically showing a transparent substrate used in Example 7.

As shown in FIG. 2, a glass plate 11 (white sheet glass supplied by HOYA Corp.) having a size of 25×75×1.1 mm on which 10 mm×75 mm×100 nm ITO films 12a and 12b were Formed was used as a transparent substrate 13, and an organic EL device $A_7$ was obtained in the following manner.

A mask was covered on the ITO Film 12a, and then a hole-injecting layer and a light-emitting layer were formed in the same manner as in Example 5. Thereafter, the mask covering the ITO film 12a was removed by means of the automatic mask exchange mechanism fixed to a vapor deposition apparatus. Then a mask was covered on the marginal portion, 5 mm wide, of the ITO film 12a along the longitudinal direction with the above mechanism. Thereafter, an opposite electrode and a protection layer were formed in the same manner as in Example 5 to give an organic EL device $A_7$.

Figure 3:
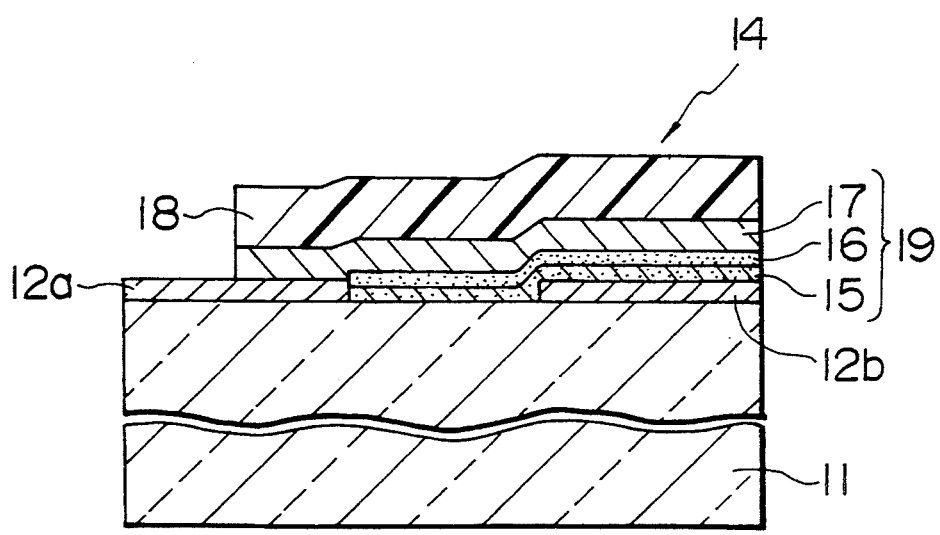
FIG. 3 is a schematic view of the cross section of the organic EL device of the present invention (in which a protection layer alone is newly formed) obtained in Example 7.

As shown in FIG. 3, in the so-obtained organic EL device $A_7$ 14, a hole-injecting layer 15 was formed from that surface portion of the glass plate 11 which was positioned between the two ITO films 12a and 12b to the main surface of the ITO film 12b, and a light-emitting layer 16 was formed on this hole-injecting layer 15. And, the opposite electrode 17 was formed on the light-emitting layer 18 and on that half of the main surface of the ITO film 12a which was to the center, and a protection layer 18 was formed on the main surface of the opposite electrode 17. In this organic EL device $A_7$ 14, a laminated structure 19 was formed of the ITO electrode 12b, the hole-injecting layer 15, the light-emitting layer 16 and the opposite electrode 17. Thus, all the layers from the hole-injecting layer to the protection layer were produced in a vacuum environment as a series.

Thereafter, the organic EL device $A_7$ 14 was taken out of the vacuum chamber, and a protection layer 18 was formed outside the protection layer 18 in the following manner.

At first, those portions of the hole-injecting layer 15, the light-emitting layer 16, the opposite electrode 17 and the protection layer 18 which were spreading 5 mm wide in the marginal portion of the ITO film 12b along its longitudinal direction were cut off. Those portions of the hole-injecting layer 15, the light-emitting layer 16, the opposite electrode 17 and the protection layer 18 which were spreading 5 mm wide along tile width direction of the glass plate 11 were also cut off such that the remaining thickness was substantially a sum of the thickness of the glass plate 11 and the ITO film thickness.

Then, there was prepared a glass plate (outer diameter: $20 \times 75 \times 5$ mm, to be referred to as "shield glass" herein after) having a $18 \times 75 \times 2$ mm concave portion and a through hole (to be referred to as "inlet" hereinafter) having a diameter of 2 mm, provided in the bottom of the concave portion. This shield glass and the organic EL device $A_7$ 14 were bonded to each other with an epoxy-based adhesive (trade name: Cemedine Hisuper 5, supplied by Cemedine Co., Ltd.). The epoxy-based adhesive was applied to the marginal portion of the above organic EL device $A_7$ 14 so that a $20 \times 75$ mm rectangular form having a line width of 1 mm was formed, after its main component and curing agent were mixed and stirred with a spatula 20 times. Further, the bonding of the shield glass and the organic EL device $A_7$ 14 was carried out such that the opposite electrode 17 and the protection layer 18 went into the concave portion of the shield glass. After the bonding, the device was allowed to stand in the atmosphere for 10 hours to cure the epoxy-based adhesive.

Then, a silicone oil (trade name: TSK451, supplied by Toshiba Corp., to be referred to as "insulating oil" hereinafter) in which 8% by volume of silica gel (particle diameter 50 μm) for moisture absorption was dispersed was injected through the inlet provided in the shield glass so that the space formed with the concave portion of the shield glass and the organic EL device $A_7$ 14 was filled with the insulating oil. This insulating oil corresponds to a shield layer.

Thereafter, the inlet was sealed with a glass cover to give an organic EL device $B_3$ in which the shield layer was formed outside the protection layer. The glass cover was bonded to tile shield glass with the above epoxy-based adhesive.

Figure 4:
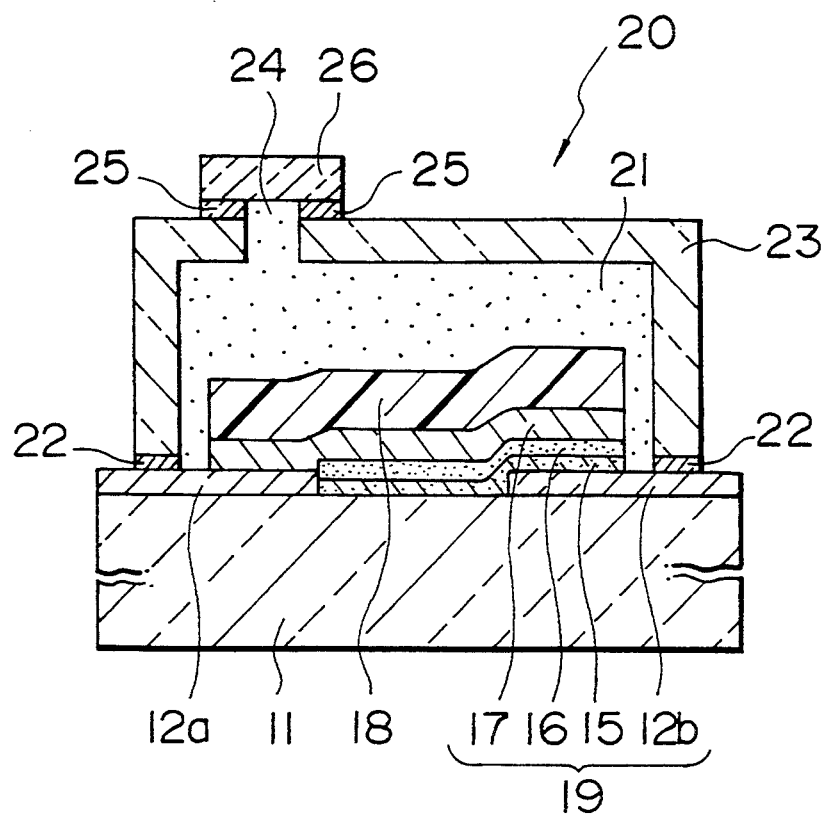
FIG. 4 is a schematic view of the cross section of the organic EL device of the present invention (in which a shield layer is formed outside a protection layer) obtained in Example 7.

FIG. 4 schematically shows the end face of the Finally obtained organic EL device $B_3$. As shown in FIG. 4, the organic EL device $B_3$ 20 had a laminated structure 19 formed of the ITO film 12b formed on the surface of the glass plate 11, the hole-injecting layer 15, the light-emitting layer 16 and the opposite electrode 17, and the protection layer 18 formed of a Teflon AF thin film was provided on the outer surface of the laminated structure 19. The shield layer 21 formed of the insulating oil was provided outside the protection layer 18, and the shield glass 23 which was bonded in place with the epoxy-based adhesive 22 to form tile shield layer 21 was positioned outside the shield layer 21. Further, the inlet 24 provided in the shield glass 23 was sealed with a glass cover 26 which was bonded in place with the epoxy-based adhesive 25. The opposite electrode 17 was also in contact with the ITO Film 12a Formed on the surface of the glass plate 11.

EXAMPLE 9

A laminated structure having an ITO electrode, a hole-injecting layer, a light-emitting layer and an opposite electrode was formed on a glass plate in the same manner as in Example 5.

Then, a fluorine-containing polymer layer [PCTFE thin film (protection layer)] having a layer thickness of 1.2 μm (1,200 nm) was formed on the outer surface of the laminated structure formed on the glass plate in the same manner as in Example 5 except that 1.8 g of pellets of polychlorotrifluoroethylene (PCTFE) (trade name: Kel-F, supplied by 3M Co., Ltd.) was used as a deposition source and that the temperature for heating the deposition source was set at 478° C. At this time, the substrate temperature was at room temperature. The formation of the protection layer on the outer surface of the laminated structure gave an organic EL device $A_8$ of the present invention.

Thereafter, a shield layer was formed outside the protection layer in the same manner as in Example 6 to give an organic EL device $B_4$ of the present invention.

EXAMPLE 10

A laminated structure having an ITO electrode, a hole-injecting layer, a light-emitting layer and an opposite electrode was formed on a glass plate in the same manner as in Example 5.

Then, a fluorine-containing polymer layer [Cytop thin film (protection layer)] having a layer thickness of 0.8 μm (800 nm) was formed on the outer surface of the laminated structure formed on the glass plate in the same manner as in Example 5 except that 1.5 g of a press plate of an amorphous radical polymer powder (trade name: Cytop, supplied by Asahi Glass Co., Ltd., intrinsic viscosity 0.425) obtained from 65.8 mol. % of tetrafluoroethylene and 34.2 mol % of perfluoroallylvinyl ether ($CF_2=CF-O-CF_2-CF=CF_2$) was used as a deposition source for a protection layer and that the temperature for heating this deposition source was set at 460° C., At this time, the substrate temperature was at room temperature. The formation of the protection layer on the outer surface of the laminated structure gave an organic EL device $A_9$ of the present invention.

A shield layer was formed outside the protection layer in the same manner as in Example 6 to give an organic EL device $B_5$ of the present invention.

COMPARATIVE EXAMPLE 1

Example 1 was repeated except that the fluorine-containing polymer layer [PCTFE thin film] was not formed, to give an organic EL device.

COMPARATIVE EXAMPLE 2

Example 3 was repeated except that the fluorine-containing polymer layer [Teflon AF thin film] was not formed, to give an organic EL device.

COMPARATIVE EXAMPLE 3

Example 4 was repeated except that the fluorine-containing polymer layer [Cytop thin film] was not formed, to give an organic EL device.

COMPARATIVE EXAMPLE 4

An organic EL device (having no protection layer) was obtained in the same manner as in Example 5, and neither a protection layer nor a shield layer was formed on this organic EL device.

COMPARATIVE EXAMPLE 5

An organic EL device (having no protection layer) was obtained in the same manner as in Example 5, and a cured layer of an epoxy-based adhesive was formed directly on the opposite electrode of this organic EL device in the same manner as in Example 7.

The organic EL devices obtained in the above Examples 1 to 10 and Comparative Examples 1 to 5 were tested on their lives in the following manner.

Life Test 1

The organic EL devices obtained finally in Example 1, Example 2, Example 3, Example 4, Comparative Example 1, Comparative Example 2 and Comparative Example 3 were allowed to stand in the atmosphere for 2 days, and then, while a direct current at a constant value (1.0 mA) was being applied to each sample, the brightness and charged voltage were measured in the atmosphere at predetermined time intervals.

Figure 5:
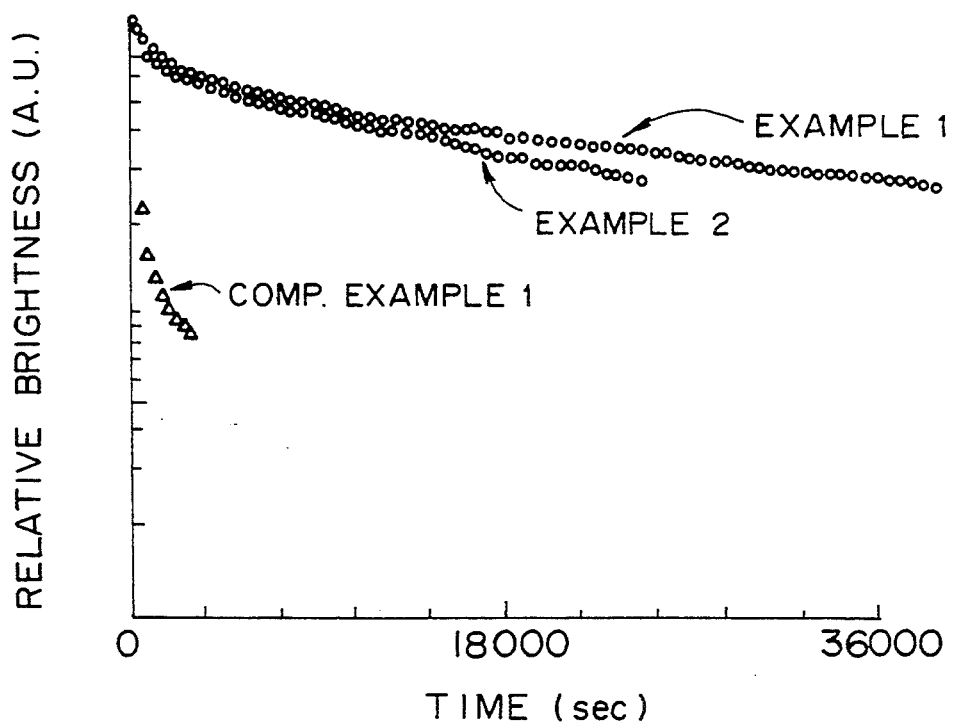
FIG. 5 is a chart showing the measurement results of brightness of organic EL devices obtained in Example 1, Example 2 and Comparative Example 1.
Figure 6:
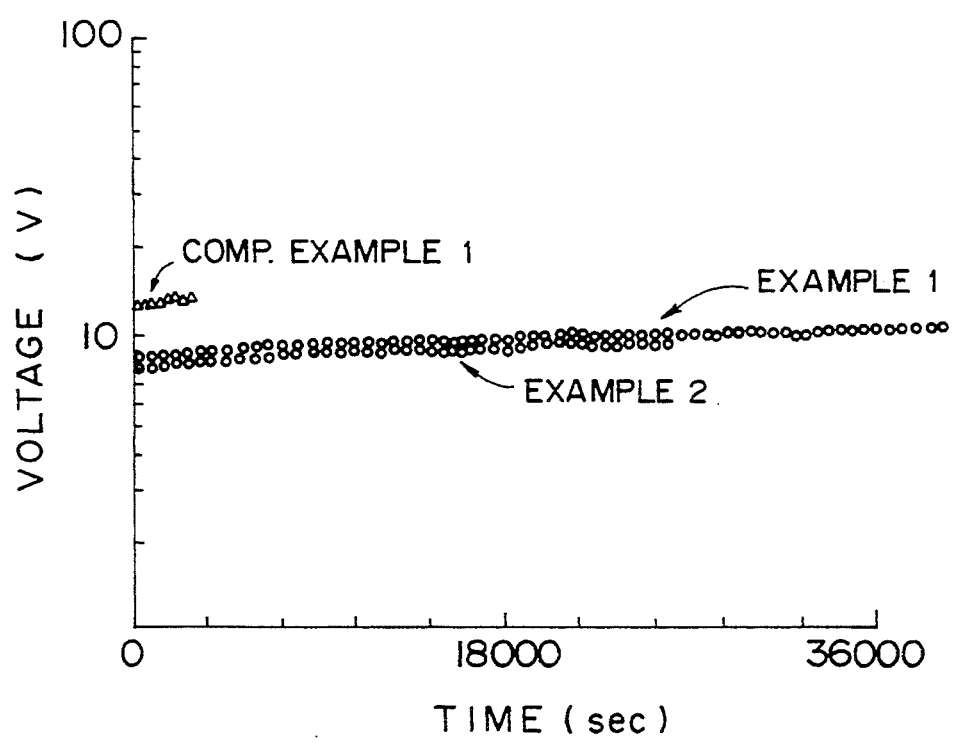
FIG. 6 is a chart showing the measurement results of voltages applied to organic EL devices obtained in Example 1, Example 2 and Comparative Example 1.
Figure 7:
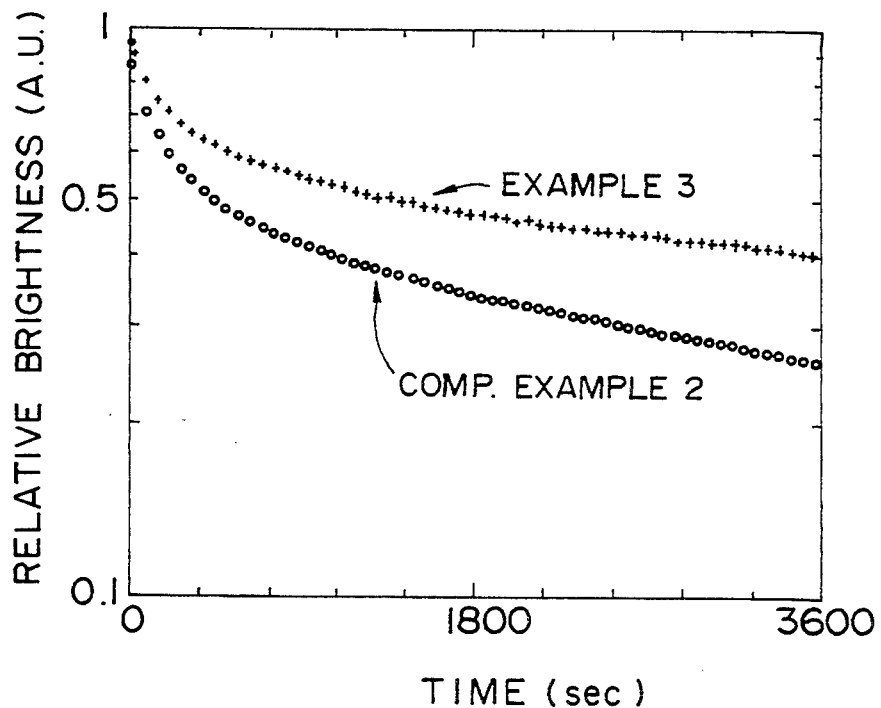
FIG. 7 is a chart showing the measurement results of brightness of organic EL devices obtained in Example 3 and Comparative Example 2.
Figure 8:
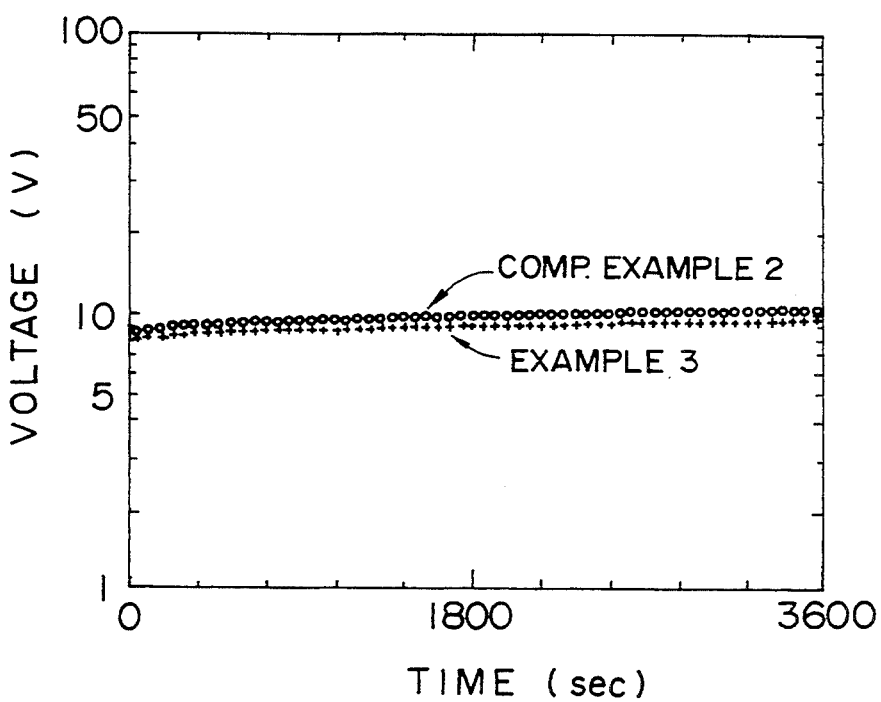
FIG. 8 is a chart showing the measurement results of voltages applied to organic EL devices obtained in Example 3 and Comparative Example 2.
Figure 9:
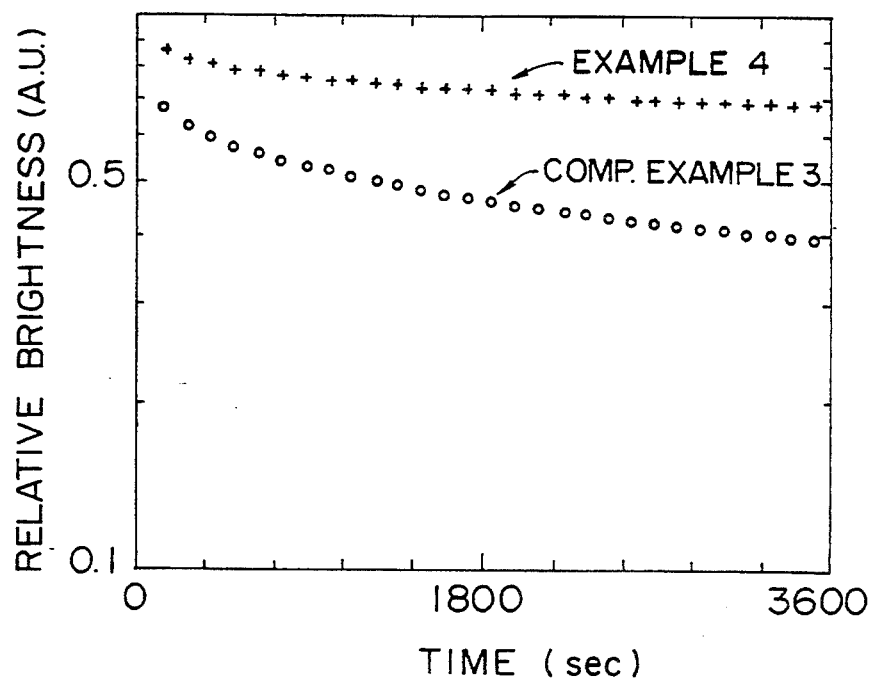
FIG. 9 is a chart showing the measurement results of brightness of organic EL devices obtained in Example 4 and Comparative Example 3.
Figure 10:
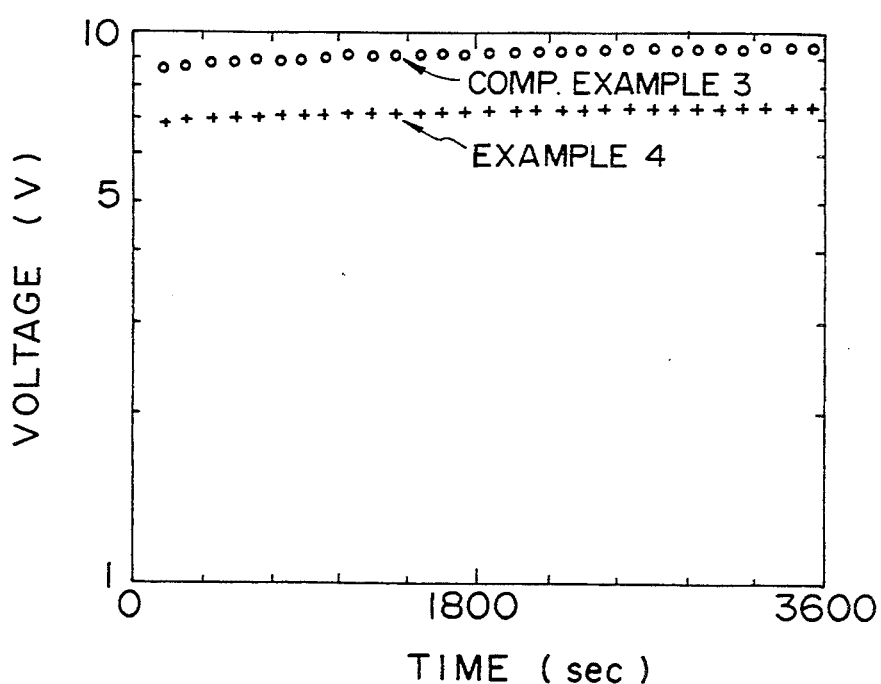
FIG. 10 is a chart showing the measurement results of voltages applied to organic EL devices obtained in Example 4 and Comparative Example 3.

Of these measurement results, the results of measurement of the organic EL devices obtained in Example 1, Example 2 and Comparative Example 1 for a brightness are shown in FIG. 5, the results of measurement of the organic EL devices obtained in Example 1, Example 2 and Comparative Example 1 for a charged voltage, in FIG. 6, the results of measurement of the organic EL devices obtained in Example 3 and Comparative Example 2 for a brightness, in FIG. 7, the results of measurement of the organic EL devices obtained in Example 3 and Comparative Example 2 for a charged voltage, in FIG. 8, the results of measurement of the organic EL devices obtained in Example 4 and Comparative Example 3 for a brightness, in FIG. 9, and the results of measurement of the organic EL devices obtained in Example 4 and Comparative Example 3 for a charged voltage, in FIG. 10.

Figure 11:
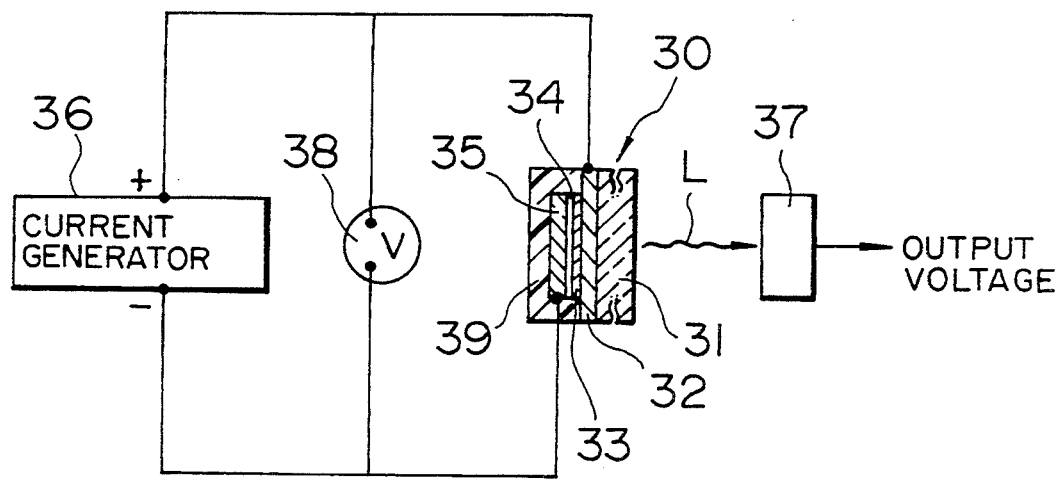
FIG. 11 is a schematic view showing the method of brightness measurement in a life test.

The measurement of the brightness was carried out, as shown in FIG. 11, by continuously providing a current from a current generator 36 to an organic EL device 30 in which an ITO electrode 32 formed on the surface of a substrate 31 of the organic EL device 30 was an anode and an opposite electrode 35 formed on the ITO electrode 32 through a hole-injecting layer 33 and a light-emitting layer 34 was a cathode, photoelectrically transferring light L from the organic EL device 30 with a photodiode 37 and calculating a relative brightness on the basis of the value of an output voltage from the photodiode 37. Further, the charged voltage was measured with time by means of a voltmeter 38 as shown in FIG. 11. In addition, in the organic EL device 30 shown in FIG. 11, a laminated structure having the ITO electrode 32, the hole-injecting layer 33, the light-emitting layer 34 and the opposite electrode 35 was provided with a protection layer 39 on the outer surface thereof.

As is clear in FIGS. 5 to 10, the lives of the organic EL devices of the present invention obtained in Examples 1 to 4 are overwhelmingly longer than those of the organic EL devices of Comparative Examples 1 to 3 which were provided with no protection layer on the outer surfaces of their laminated structures. This shows that the infiltration of water and oxygen into the light-emitting layers has been prevented by the protection layers.

Life Measurement 2

The organic EL devices finally obtained in Example 1, Example 4, Example 3, Example 6, Example 7, Example 8, Example 9, Example 10 and Comparative Example 5 were allowed to stand in atmosphere for 7 days, and then a direct current was provided to each sample such that the initial brightness was 100 cd/m². Thereafter, each sample was measured for a brightness at a constant current (direct current value at which the initial brightness was 100 cd/m²) in the atmosphere at predetermined time intervals, and a time required for the brightness to be reduced to ½ of the initial brightness was measured. Further, while a current was continuously applied after the brightness was reduced to ½, a time required for the brightness to be reduced to 0 cd/m² was measured, and this time was taken as a destruction time of the device.

In addition, the brightness was measured by continuously providing a current from a direct current source to the organic EL device in which the ITO film on which the electron-injecting layer was formed was an anode and the opposite electrode formed on the ITO film through the hole-injecting layer and the light-emitting layer was a cathode, photoelectrically transferring EL light from the organic EL device with a photodiode and calculating the brightness on the basis of the so-obtained output voltage.

Table 1 shows the measurement results.

TABLE 1

| Organic EL device | Time required for brightness to be reduced to ½ of initial brightness* | Destruction time of device |
| --- | --- | --- |
| Organic EL device $A_1$ of Example 1 | 120 hours | 1,500 hours |
| Organic EL device $A_4$ of Example 4 | 100 hours | 1,000 hours |
| Organic EL device $A_5$ of Example 5 | 100 hours | 1,000 hours |
| Organic EL device $B_1$ of Example 6 | 1,200 hours | 5,000 hours or more |
| Organic EL device $B_2$ of Example 7 | 700 hours | 3,000 hours or more |
| Organic EL device $B_3$ of Example 8 | 1,100 hours | 5,000 hours or more |
| Organic EL device $B_4$ of Example 9 | 1,500 hours | 5,000 hours or more |
| Organic EL device $B_5$ of Example 10 | 1,200 hours | 5,000 hours or more |
| Organic EL device of Comparative Example 4 | 30 hours | 300 hours |
| Organic EL device of Comparative Example 5 | Device was too corroded with adhesive to emit light | |

*: Initial brightness was 100 cd/m².

As is shown in Table 1, any one of the organic EL devices having protection layers (organic EL devices A and organic EL devices B), obtained in Examples, has a much longer life than the organic EL device having no protection layer, obtained in Comparative Example. And, each of the organic EL devices having shield layers outside the protection layers, obtained in Examples 6 to 10, has a longer life than any one of the organic EL devices A of the present invention having the protection layers alone (organic EL devices A obtained in Examples 1, Example 4 and Examples 5).

As is clear from the results of the above-described life test 1 and life test 2, organic EL devices having a long life can be provided by working the present invention.

We claim:

1. An organic electroluminescent device comprising (a) a laminated structure including a light-emitting layer formed of a luminescent organic solid which is disposed between mutually opposing positive and negative electrodes, the luminescent organic solid being injectable with electrons from the negative electrode and holes from the positive electrode when direct current is charged between the positive electrode and the negative electrode and thereby having an excited state therein to recombine the electrons and the holes injected into the luminescent organic solid for light emission, and (b) a film of an electrically insulating polymer compound as a protection layer which is deposited on an outer surface of the laminated structure, said film being formed of at least one layer of a fluorine-containing copolymer obtained by copolymerizing a monomer mixture containing tetrafluoroethylene and at least one cyclic ether compound having a carbon-carbon unsaturated bond of the formula

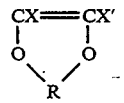

wherein each of X and X' is selected from the group consisting of F, Cl and H,

X and X' are the same or different from each other, and R is —CF=CF— or has the formula

wherein each of R' and R" is selected from the group consisting of F, Cl, —COF a —COO $C_1$-$C_6$-alkyl group, a $C_1$-$C_6$-alkyl group, an unsubstituted perfluorinated $C_1$-$C_6$-alkyl group and a hydrogen-substituted perfluorinated $C_1$-$C_6$-alkyl group.

2. The organic electroluminescent device according to claim 1 wherein the protection layer is a film of an electrically insulating polymer compound formed by a physical vapor deposition method.

3. The organic electroluminescent device according to claim 2, wherein the physical vapor deposition method is a 4. An organic electroluminescent device comprising
(a) a laminated structure comprising a light-emitting layer formed of a luminescent organic solid which is disposed between mutually opposing positive and negative electrodes, the luminescent organic solid being injectable with electrons from the negative electrode and holes from the positive electrode when direct current is charged between the positive electrode and the negative electrode and thereby having an excited state therein to recombine the electrons and the holes injected into the luminescent organic solid for light emission, and
(b) a film of an electrically insulating polymer compound as a protection layer deposited on an outer surface of the laminated structure, said protection layer with moisture resistance being provided with a shield layer on an outer surface of the protection layer, the film of the polymer having a layer structure formed of at least one layer of a fluorine-containing copolymer, wherein the fluorine-containing copolymer is a copolymer obtained by copolymerizing a monomer mixture containing tetrafluoroethylene and at least one cyclic ether compound having a carbon-carbon unsaturated bond of the formula

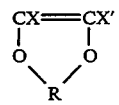

wherein each of X and X' is selected from the group consisting of F, Cl and H,

X and X' are the same or different from each other, and R is —CF=CF— or has the formula

wherein each of R' and R" is selected from the group consisting of F, Cl, —COF a —COO $C_1$-$C_6$-alkyl group, a $C_1$-$C_6$-alkyl group, an unsubstituted perfluorinated $C_1$-$C_6$-alkyl group and a hydrogen-substituted perfluorinated $C_1$-$C_6$-alkyl group.

5. The organic electroluminescent device according to claim 4, wherein the shield layer is formed of one selected from the group consisting of an electrically insulating glass, an electrically insulating polymer compound and an electrically insulating airtight fluid contained in an electrically insulating container.

6. An organic electroluminescent device comprising
(a) a laminated structure comprising a light-emitting layer formed of a luminescent organic solid which is disposed between mutually opposing positive and negative electrodes, the luminescent organic solid being injectable with electrons from the negative electrode and holes from the positive electrode when direct current is charged between the positive electrode and the negative electrode and thereby having an excited state therein to recombine the electrons and the holes injected into the luminescent organic solid for light emission, and
(b) a film of an electrically insulating polymer compound as a protection layer deposited on an outer surface of the laminated structure, said protection layer with moisture resistance being provided with a shield layer on an outer surface of the protection layer, the film of the polymer having a layer structure formed of at least one layer of a fluorine-containing copolymer, wherein the fluorine-containing copolymer is a copolymer obtained by radical-polymerizing (i) a perfluoroether having a double bond at each of the two terminals, represented by the formula (II), $$CF_2=CF-(CF_2)_n-O-(CF_2)_m-CF=CF_2 \quad (II)$$

wherein each of m and n is independently of each other, an integer of 0 to 5, and m+n is an integer of 1 to 6 and (ii) a monomer radical-polymerizable with the perfluoroether of the formula (II).

7. The organic electroluminescent device according to claim 1, wherein said cyclic ether compound is in an amount of 0.01 to 99% by weight based on the total amount of the tetrafluoroethylene.

8. The organic electroluminescent device according to claim 1, wherein said cyclic ether compound is in an amount of 11 to 80% by weight based on the total amount of the tetrafluoroethylene.

9. The organic electroluminescent device according to claim 8, wherein the fluorine-containing copolymer has a glass transition point of not less than 50° C.

10. The organic electroluminescent device according to claim 9, wherein the cyclic ether compound is selected from the group consisting of

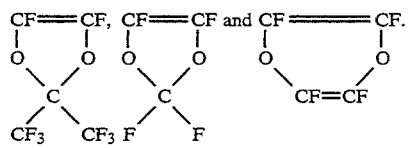

11. The organic electroluminescent device according to claim 13, wherein cyclic ether compound is in an amount of 0.01 to 99% by weight based on the total amount of the tetrafluoroethylene.

12. The organic electroluminescent device according to claim 13, wherein the cyclic ether compound is in an amount of 11 to 80% by weight based on the total amount of the tetrafluoroethylene.

13. The organic electroluminescent device according to claim 12, wherein the fluorine-containing copolymer has a glass transition point of not less than 50° C.

14. The organic electroluminescent device according to claim 13, wherein the cyclic ether compound is selected from the group consisting of

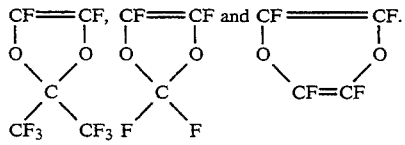

15. The organic electroluminescent device according to claim 6, wherein the perfluoroether is selected from the group consisting of perfluoroallylvinylether, perfluorodiallyether, perfluorobutenylvinylether, perfluorobutenylallylether and perfluorodibutenylether.

* * * * *